United States Patent [19]
Kawano et al.

[11] Patent Number: 5,499,258
[45] Date of Patent: Mar. 12, 1996

[54] AUTOMATIC TEMPERATURE CONTROL CIRCUIT OF LASER DIODE AND ELECTRIC/OPTICAL SIGNAL CONVERTING UNIT USING THE SAME

[75] Inventors: Michinao Kawano; Setsuo Misaizu; Tomoko Anzai, all of Yokohama; Takashi Tsuda, Kawasaki, all of Japan

[73] Assignee: Fujitsu Limited, Kanagawa, Japan

[21] Appl. No.: 353,125

[22] Filed: Dec. 9, 1994

[30] Foreign Application Priority Data

May 19, 1994 [JP] Japan .................................. 6-129807

[51] Int. Cl.$^6$ ...................................................... H01S 3/04
[52] U.S. Cl. ........................................... 372/34; 372/38
[58] Field of Search ......................................... 372/34, 38

[56] References Cited

U.S. PATENT DOCUMENTS 5,383,208  1/1995  Queniat et al. ............................ 372/38

Primary Examiner—Leon Scott, Jr.

[57] ABSTRACT

An automatic temperature control circuit of a laser diode solves a problem that a temperature control becomes unstable when switching to heat or cool the laser diode. In the circuit, a peltier element changes the temperature of the laser diode by heating or cooling, a temperature detecting section detects the temperature of the laser diode and outputs the corresponding detected voltage, an error amplifying section outputs an error voltage by comparing the detected outputted voltage with a fixed value, a peltier current control section controls the direction of a driving current flowing to the peltier element in correspondence with an error voltage outputted from the error amplifying section. In addition, there is provided a circuit which feed-backs a voltage corresponding to the driving current flowing to the peltier element to an input side of the error amplifying section and adds it to the detected voltage outputted from the temperature detecting section.

18 Claims, 8 Drawing Sheets

AUTOMATIC TEMPERATURE CONTROL CIRCUIT OF LASER DIODE AND ELECTRIC/OPTICAL SIGNAL CONVERTING UNIT USING THE SAME

BACKGROUND OF THE INVENTION

1. Field of the Invention

The present invention relates to an automatic temperature control circuit of a laser diode and an electric/optical signal converting unit using the same.

2. Description of the Related Art

An optical communication becomes indispensable according to that high speed and wide-band communication has been widely desired in recent years. In the optical communication system, the communication is performed by modulating an optical power of a laser diode with an electric signal, and sending the modulated light-signal via an optical transmission path in general.

Although the optical power of the laser diode is also used in other technical fields besides the optical communication, it is commonly expected that the optical power of the laser diode is stable, more particularly, for a temperature.

The laser diode employed in this explanation has a characteristic that the laser diode radiates when the value of current flowing to the diode exceeds the value of a threshold current (Ith). Further, the diode has another characteristic of outputting an optical signal modulated with a driving current obtained by piling an electrical pulse signal upon the threshold current (Ith).

The threshold current (Ith) employed in this explanation has a characteristic of varying depending on a temperature, because the laser diode is a semiconductor device. Further, it is general that there is a dispersion in a characteristic of each laser diode. Therefore, it becomes a problem that the optical power of each of laser diodes is different.

When showing these characteristic in the diagram, it becomes as FIG. 7. In FIG. 7, a driving current is shown in the axis of abscissas, and an optical power is shown in the axis of ordinates. One characteristic I shown in the diagram is that the threshold current is Ith, so that a bias current $I_B$ is supplied, and the signal current Ip is piled up to obtain the optical power P.

Further, if the temperature goes up, the characteristic I is changed to the characteristic II. Then, the threshold current becomes Ith', so that the bias current IB' is supplied, and the signal current further becomes Ip' to obtain the same optical power P.

Accordingly, an automatic optical power control circuit (APC) for detecting an optical power from a laser, and controlling the bias current and the signal current to make the optical power P constant has been provided in the conventional circuit.

Supposing that the relation between the threshold current Ith and the signal current Ip for obtaining a constant optical power has such a linearity characteristic shown in FIG. 8, in the automatic optical power control circuit (APC), control coefficients for the bias current and the signal current have been determined.

However, in the case where the temperature of the laser diode becomes higher than a predetermined value, according to the diversion of characteristic of the laser diode as described above, there is a possibility to have a characteristic shown in III of FIG. 7, for example, at the temperature that the threshold current becomes Ith'. In this case, the optical power becomes P', not P in the signal current Ip' which has same value as that of II.

Therefore, it is not sufficient that the relation between the threshold current Ith and the signal current Ip for obtaining a constant optical power is considered only on the basis of the linearity relation shown in FIG. 8. Thus, it was required to provide an automatic temperature control circuit (ATC) for controlling the temperature of the laser diode within a fixed range in the conventional circuit.

FIG. 9 shows a structural diagram of the conventional automatic temperature control circuit (ATC) prepared for above-explained objections. In the diagram, a temperature detecting section 1 comprises a thermistor 10 for showing an impedance corresponding to a temperature of a laser diode, not shown in the diagram, a variable resistor 11 connected to the thermistor 10 in series and a non-inverse amplifier 12.

Accordingly, an impedance of the thermistor 10 is changed in correspondence with the temperature of the laser diode, that is, the impedance of the thermistor 10 becomes smaller and the input voltage of the non-inverse amplifier 12 goes up, when the temperature goes up. An error amplifying section 2 comprises an operational amplifier 20 connecting an input resistor R1 and a feedback resistor Rf. A reference voltage $V_{REF}$ 21 is connected to one input terminal of the operational amplifier 20, and the output detected in the temperature detecting section 1 is inputted to other input terminal via the input resistor R1.

A differential voltage between the reference voltage $V_{REF}$ 21 and the output detected in the temperature detecting section 1 is outputted from the operational amplifier 20.

A current controlling section 7, comprising a pair of variable resistors 71 and 72, converts the voltage outputted from the operational amplifier 20 in the error amplifier 2 to the current, and the resistance values are variably controlled so as to equalize the size of the currents that flow through the resistors.

A peltier element driving section 3 comprises a class B push-pull power amplifying circuit composed of transistors 30 and 32 and transistors 31 and 33.

The class B push-pull power amplifying circuit is composed so as that the emitters of transistors 32 and 33 are connected in common, the emitter of the transistor 30 on the previous portion and the collector of the transistor 31 on the previous portion are connected to each of bases of the power transistor 32 connected to a collector resistance R7 and the power transistor 33 connected to a collector resistor R8.

Accordingly, if the temperature of the laser diode goes up, the output voltage of the non-inverse amplifier 12 becomes larger. Therefore, the output from the operational amplifier 20 in the error amplifying section 2 becomes larger toward the negative direction so that the transistor 31 becomes in the ON state and the power transistor 33 becomes in the ON state in correspondence with that the transistor 30 in the peltier element driving section 3 becomes in the OFF state and the power transistor 32 becomes in the OFF state.

Therefore, a cooling current in X direction flows to a peltier element 4, so that the temperature of the laser diode goes down. In opposite, if the temperature of the laser diode goes down, the transistor 32 becomes in the ON state, so that a heating current in Y direction flows to the peltier element 4. In this way, the current flowing to the peltier element 4 is controlled to keep the temperature of the laser diode constant.

The conventional temperature control described above will be further considered. As shown in FIG. 9, both ends of the push-pull output portion are composed of two sets of double transistors 30 and 32, and 31 and 33, respectively.

It is now considered that the case where the state of a set of output transistors 31 and 33 is changed from conductivity to non-conductivity, because of going up or going down of the temperature. It is required for making the output transistors 30 and 32 in the conductive state to generate the potential difference, which becomes more than the sum ($V_{BE0}+V_{BE2}$) of the voltage $V_{BE0}$ between the base and the emitter of the transistor 30 and the voltage $V_{BE2}$ between the base and the emitter of the transistor 32, between the base of the transistor 30 and the emitter of the transistor 32.

Accordingly, as described in the temperature control characteristic a of the conventional temperature control circuit shown in FIG. 3, a dead band is generated when the state of conductivity is changed to the state of non-conductivity between one set of the transistors 31 and 33 and other set of transistors 30 and 32 of the output portions.

In FIG. 3, the axis of abscissas shows an ambient temperature of module for storing the laser diode, and the axis of ordinates shows the temperature of the laser diode. The temperature controlling characteristic a of the conventional circuit in FIG. 3 shows the situation of that the temperature of the laser diode is controlled so as to be 25° C., when the ambient temperature becomes more than 25° C.

Consequently, the temperature of the laser diode becomes less than 25° C., when the ambient temperature of module becomes less than 25° C., for the dead band existence.

On the other hand, does not depend on the consideration that how many amperes of the current should flow to the peltier element to control the temperature control circuit, that the ambient temperature 80° C. is controlled to 40 ° C., in the case where the setting temperature is 40° C. and then the ambient temperature controlled to be 80° C. That is, it is depends on the consideration that the temperature is stabilized by flowing a larger current for controlling so as to move to the setting temperature in an instant, cooling or heating, and bringing the value close to the adjacent to the setting temperature.

Therefore, it was apprehended to break down the circuit because the larger current flowed to the peltier element for controlling the ambient temperature to the setting temperature, in the case where there was a gap between the ambient temperature and the setting temperature when the power was supplied. In the conventional circuit shown in FIG. 9, the output of the operational amplifier 20 was saturated, and the variable resistors 71 and 72 in the current control section 7 were controlled variably to limit such a larger current.

Consequently, amplification rates of the transistors 30 and 31 on the latter portions, the $V_{BE}$, the output of the operational amplifier 20 are dispersed, individually. That brings another problem that test steps are increased, because it is required to control those values, individually. Further, there is also a problem that a limited value of the current flowing to the peltier element is fluctuated because the voltage $V_{BE}$ between the base and the emitter of the transistors is fluctuated according to the temperature.

Meanwhile, a circuit module is placed on a test tool for performing the tests in the conventional circuit shown in FIG. 9. Therefore, it is apprehended that plus-minus power sources are individually supplied to the circuit module by a testing operator, and therefore, there is a possibility of the supply of only one power source.

In the conventional circuit shown in FIG. 9, for example, in the case where only −5.2 V is supplied when it is required to control toward the heating direction, the output from the error amplifying section 2 becomes a potential of approximately −4 V. And the bases of the transistors 30 and 31 on the previous portions in the peltier driving section 3 become low, the transistor 31 becomes in the conductivity state, so that the cooling current toward the X direction flows. Therefore, that brings other problem that the current flows in the direction reverse to the direction to be controlled.

SUMMARY OF THE INVENTION

Accordingly, it is an object of the present invention to provide an automatic temperature control circuit of a laser diode to overcome a drawback such that a dead band exists in the above-described case where cooling or heating is switched, and then the temperature control becomes insecure within the dead band.

It is another object of the present invention to provide an automatic temperature control circuit of laser diode to overcome a drawback such that it is required to limit a peltier driving current, and the limited current value is fluctuated according to the temperature.

It is further object of the present invention to provide an automatic temperature control circuit of laser diode to solve a problem that the current flows in the reversed direction to a direction for controlling the temperature of the peltier element, when only one power source is supplied.

It is yet another object of the present invention to provide an electrical/optical signal converting unit employing the automatic temperature control circuit of laser diode to solve a problem that the dead band exists in the above-described case where cooling or heating is switched, and then the temperature control becomes insecure within the dead band.

A further object of the present invention to provide an electric/optical signal converting unit employing the automatic temperature control circuit of laser diode to overcome a drawback that it is required to limit a peltier driving current, and the limited current value is fluctuated according to the temperature.

It is another object of the present invention to provide an electric/optical signal converting unit employing the automatic temperature control circuit of laser diode to solve a problem that the current flows in the reversed direction to a direction for controlling the temperature of the peltier element, when only one power source is supplied.

In carrying out this invention, as a basic structure, an automatic temperature control circuit of laser diode according to the present invention comprises a peltier element for changing the temperature of the laser diode by heating or cooling, a temperature detecting section for detecting the temperature of the laser diode and outputting a corresponding voltage, an error amplifying section for outputting the error voltage by comparing the detected voltage outputted from the temperature detecting section with a predetermined value, a peltier current driving section for controlling a direction of the driving current flowing to the peltier element in correspondence with the error voltage outputted from the error amplifying section, and a circuit for feed-backing a voltage corresponding to the driving current flowing to the peltier element to an input side of the error amplifying section, and adding it to the detected voltage outputted from the temperature detecting section.

Further, as a basic structure, an electric/optical signal converting unit employing the automatic temperature control circuit of laser diode according to the present invention comprises an automatic power control section having a laser diode unit including a laser diode and a photo diode for detecting an optical power of the laser diode by the photo diode and controlling the bias current (Ith) and the input signal level (Ip) in correspondence with the detected optical power level, and an automatic temperature control section having a peltier element unitedly stored in the laser diode unit for changing a temperature of the laser diode by heating or cooling, a temperature detecting section for detecting the temperature of the laser diode and outputting a corresponding detected voltage, an error amplifying section for outputting the error voltage by comparing the detected voltage outputted from the temperature detecting section with a predetermined value, a peltier current driving section for controlling a direction of a driving current flowing to the peltier element in correspondence with the error voltage outputted from the error amplifying section and a circuit for feed-backing a voltage corresponding to the driving current flowing to the peltier element to an input side of the error amplifying section and adding it to the detected voltage outputted from the temperature detecting section.

In the basic structure of the present invention, the automatic temperature control circuit according to the present invention is constructed so as that the $V_{BE}$ is reduced for two portions when the direction of the current is switched, in comparison with the conventional automatic temperature control circuit shown in FIG. 9. Further, it is constituted so as to feed back to the operational amplifiers in the error amplifying section including the peltier current driving section. Therefore, in the case where a gain of the operational amplifier is considered as infinity quantity ($\infty$), it becomes $2 \times V_{BE}/\infty \approx 0$, so that it becomes possible to reduce the temperature dead band.

And further, it also becomes possible that the electric/optical converting unit obtains more stable laser light-emission by employing the automatic temperature control circuit for reducing the temperature dead band.

DESCRIPTION OF THE PREFERRED EMBODIMENTS

Figure 1:
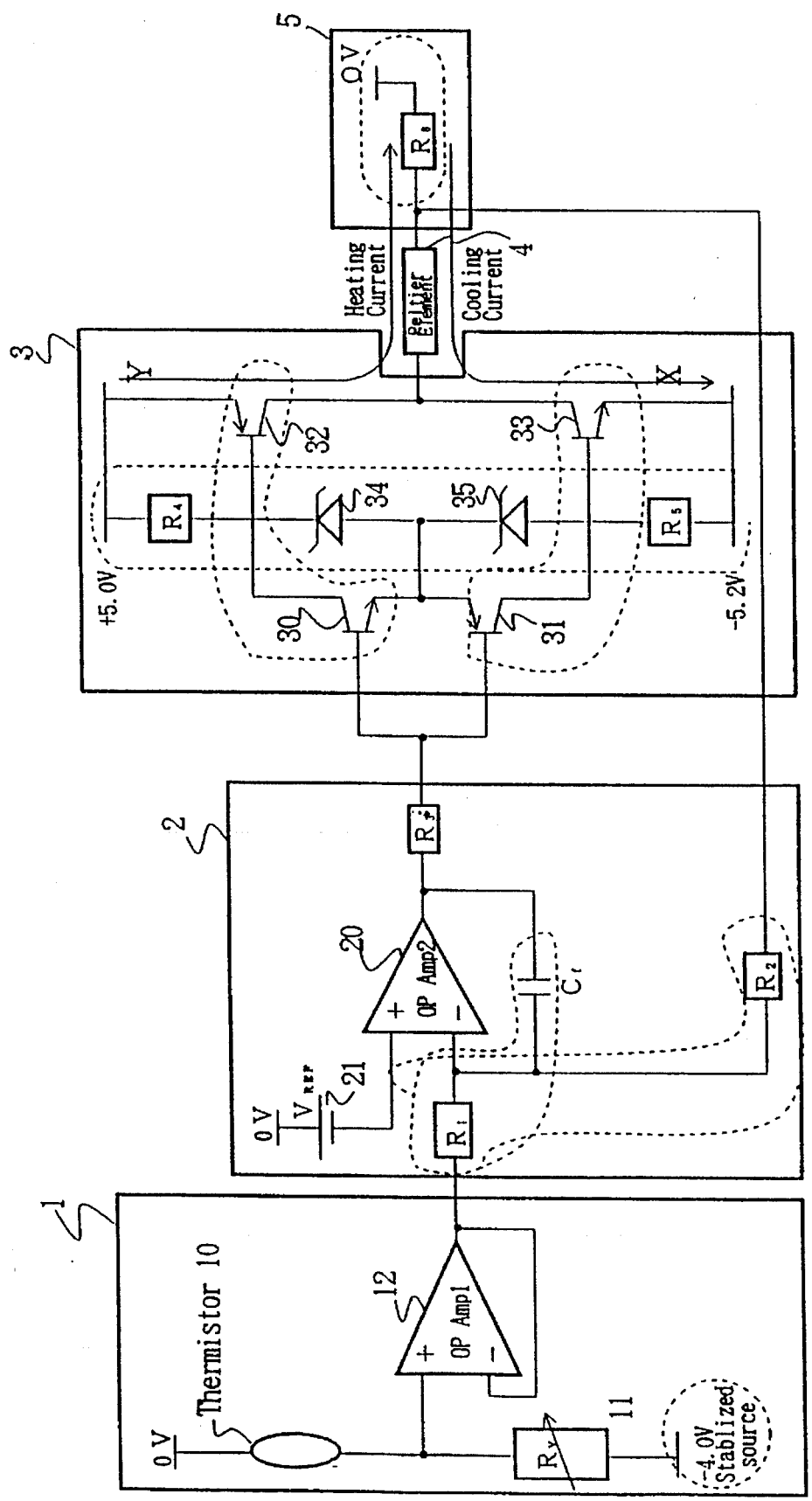
FIG. 1 shows one structural example of an automatic temperature control circuit embodying the present invention.

FIG. 1 shows one structural example of an automatic temperature control circuit according to the present invention. Throughout the following description the same reference numerals and signs are used to denote identical or corresponding components.

In FIG. 1, a temperature detecting section 1 comprises a thermistor 10 for showing an impedance corresponding to the temperature of a laser diode, not shown in the diagram, and a variable resistor 11 which is connected to the thermistor 10 in series and a non-inverse amplifier 12. Further, voltage −4.0 V supplied from a stabilized source is supplied as a source.

Therefore, the impedance of the thermistor 10 is changed in correspondence with the temperature of the laser diode, that is, the impedance of the thermistor 10 becomes smaller, when the temperature goes up, and the input voltage of the non-inverse amplifier 12 goes up.

An error amplifying section 2 comprises an operational amplifier 20 connecting to an input resistor R1, a feedback condenser Cf and an output resistor R3. A reference voltage ($V_{REF}$) 21 is connected to one input terminal of the operational amplifier 20, and the output detected in the temperature detecting section 1, via the input resistor R1 is connected to the other input terminal.

Accordingly, a differential voltage between the reference voltage $V_{REF}$ and the output detected in the temperature detecting section 1 is outputted from the operational amplifier 20. Further, the voltage detected in a current monitoring section 5 described later is fed back via a feedback resistor R2 to the other input terminal of the operational amplifier 20.

A peltier element driving section 3 is constituted of a class B push-pull power amplifying circuit composed of transistors 30 and 32, and 31 and 33. The transistors 30 and 31 having an exact reversed polarity each other are connected in series, and bases of the transistors 30 and 31 are connected to the output of the operational amplifier 20 in common. Further, a series connecting point between the transistors 30 and 31 is connected to a connecting point between zener diodes 34 and 35 connected between the plus and minus sources in series.

Further, collectors of the transistors 30 and 31 are connected to bases of power transistors 32 and 33, respectively. The power transistors 32 and 33 having the exact reversed polarity each other, which are connected in series are inserted to the plus and minus sources.

The series connecting point of the power transistors 32 and 33 is connected to an input terminal of a peltier element 4. The output terminal of the peltier element 4 is connected to a resistor R6 in the current monitoring section 5.

In this circuit, for example, if the temperature of the laser diode goes up, the output from the error amplifying section 3 becomes larger toward the negative potential direction, and the transistor 31 becomes conductive, so that the power transistor 33 also becomes conductive, a cooling current in the X direction flows to the peltier element 4, and the temperature of the laser diode goes down.

In the present invention, the potential generated on the resistor R6 in the current monitoring section 5 is fed back to the input side of the operational amplifier 20 in the error amplifying section 2 in proportion to the current flowing to the peltier element 4. According to this structure, it becomes possible to reduce the dead band described based on FIG. 3 above. This effectiveness will be further described referring to FIG. 2 showing an equalizing circuit for explaining the operation of FIG. 1 as follows.

Figure 2:
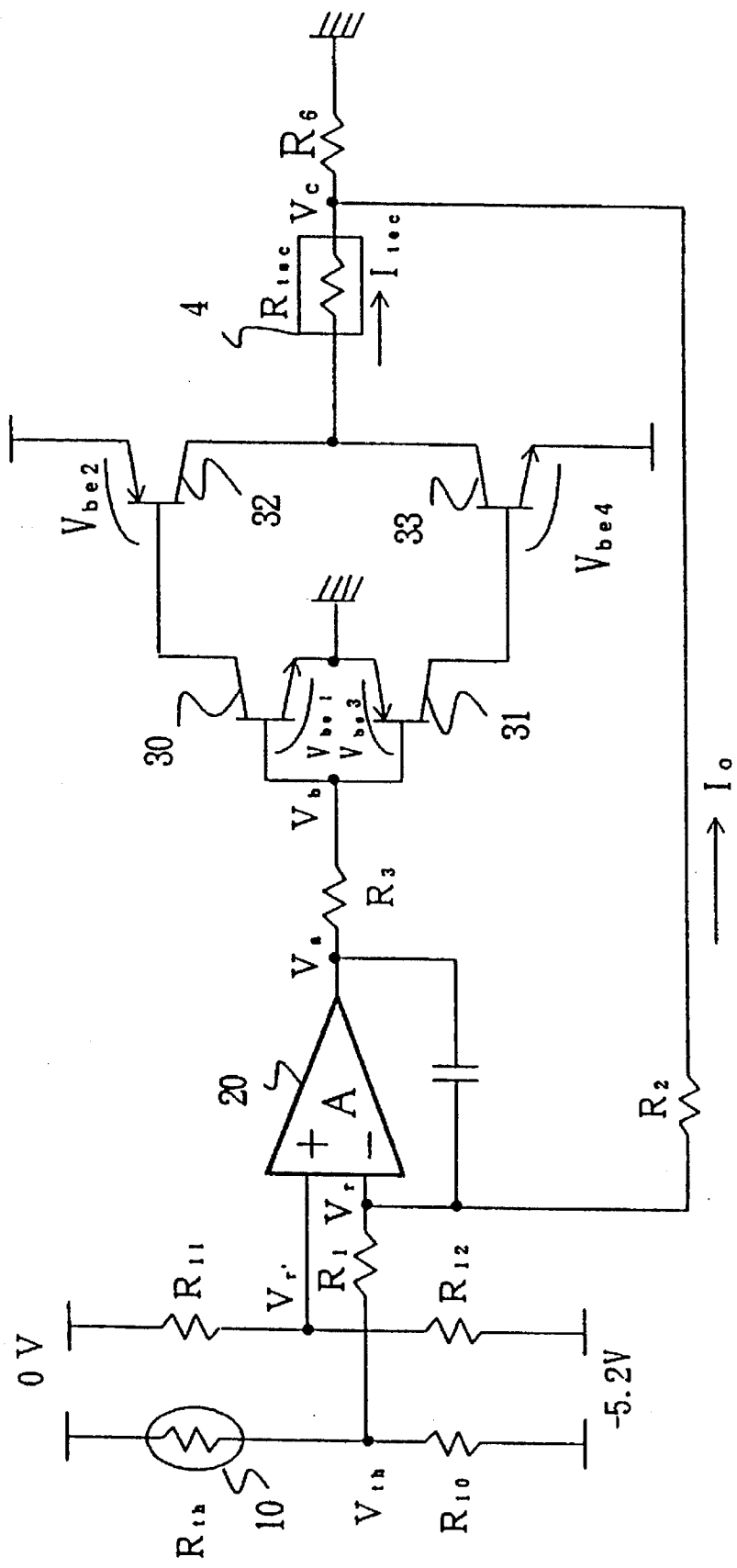
FIG. 2 is an equalizing circuit for explaining the operation shown in FIG. 1.

In FIG. 2, if the current flowing to the resistor R2 is assigned to I0, the relational expressions (1) and (2) can be led as follows;

$$(Vth-Vr)/R1=(Vc-Vr)/R2=I0 \quad (1)$$

$$Va=(Vr'-Vr)A \quad (2)$$

Provided that Vr'=R12.(−5.2 V)/(R11+ R12) and Vth= Rth. (−5.2 V)/(R10+Rth).

Accordingly, the heating current flows when the temperature goes down, and the following relation is composed;

$$(Va-Vb).h1\ h2/R3=Itec \quad (3)$$

$$Vb=Vbe1 \quad (4)$$

$$Vc/R7=Itec-I0 \quad (5)$$

Provided that h1 and h2 show current amplifying rates of the transistors 30 and 31, respectively.

If a compression error is assigned to $\Delta V_H$=Vr'−Vr, it becomes according to the expressions (2) to (5), as follows;

$$\begin{aligned}\Delta V_H &= Vr' - Vr = Va/A \quad (6)\\ &= (R3 \cdot Itec/h1h2 + Vbe1)/A\end{aligned}$$

On the other hand, the cooling current flows when the temperature goes up, and the relation is composed as follows;

$$(Va-Vb).h3\ h4/R3=Itec \quad (7)$$

$$Vb=-Vbe3 \quad (8)$$

Provided that h3 and h4 show current amplifying rates of the transistors 31 and 33, respectively.

Further, if the compression error is assigned to $\Delta V_C$= Vr' −Vr, it becomes according to the expressions (2), (7) and (8), $$\begin{aligned}\Delta V_C &= Vr' - Vr = Va/A \quad (9)\\ &= (R3 \cdot Itec/h3h4 - Vbe3)/A\end{aligned}$$

The temperature variations of compression error are expressed as follows;

$$d\Delta V_H/dt=R3A/h1\ h2\ dItec/dt \quad (10)$$

$$d\Delta V_C/dt=R3A/h3\ h4\ dItec/dt \quad (11)$$

The temperature control dead band becomes as follows, if Itec=0 in the expressions (6) and (9);

$$\Delta V_H=Vbe1/A,\ \Delta V_C=-Vbe3/A \quad (12)$$

Hereupon, if the amplifying rate of the operational amplifier 20 is assigned to $\infty$, $\Delta V_H=\Delta V_C=0$, and the temperature control dead band can be ignored. The relation is further shown in FIG. 3, in comparison with the characteristic of the conventional circuit.

Figure 3:
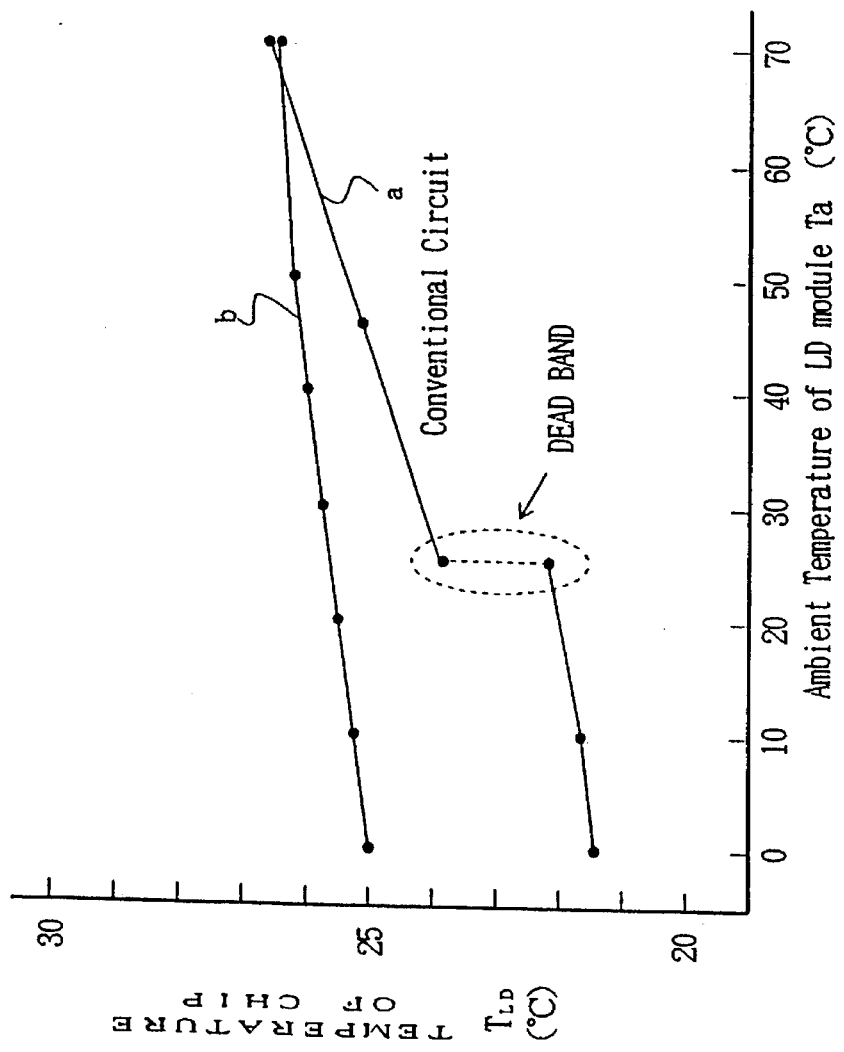
FIG. 3 is a diagram showing a temperature control characteristic of a temperature control circuit.

FIG. 3 shows temperature control characteristic with graph form, in which the ambient temperature Ta of the laser diode is shown in the axis of abscissas, that is, the temperature detected by the thermistor 10, and the temperature $T_{LD}$ of the chip of the laser diode controlled based on the temperature detected by the thermistor 10 is shown in the axis of ordinates.

In FIG. 3, although the dead band is generated in the temperature control characteristic a, the dead band is not generated in the automatic temperature control (ATC) circuit according to the present invention, as shown in the characteristic b, and the linearity relation between the ambient temperature Ta of the laser diodes and the temperature $T_{LD}$ of the laser diode chip can be obtained at adjacent to 25° C. which is the target control temperature of the laser diode.

Figure 4:
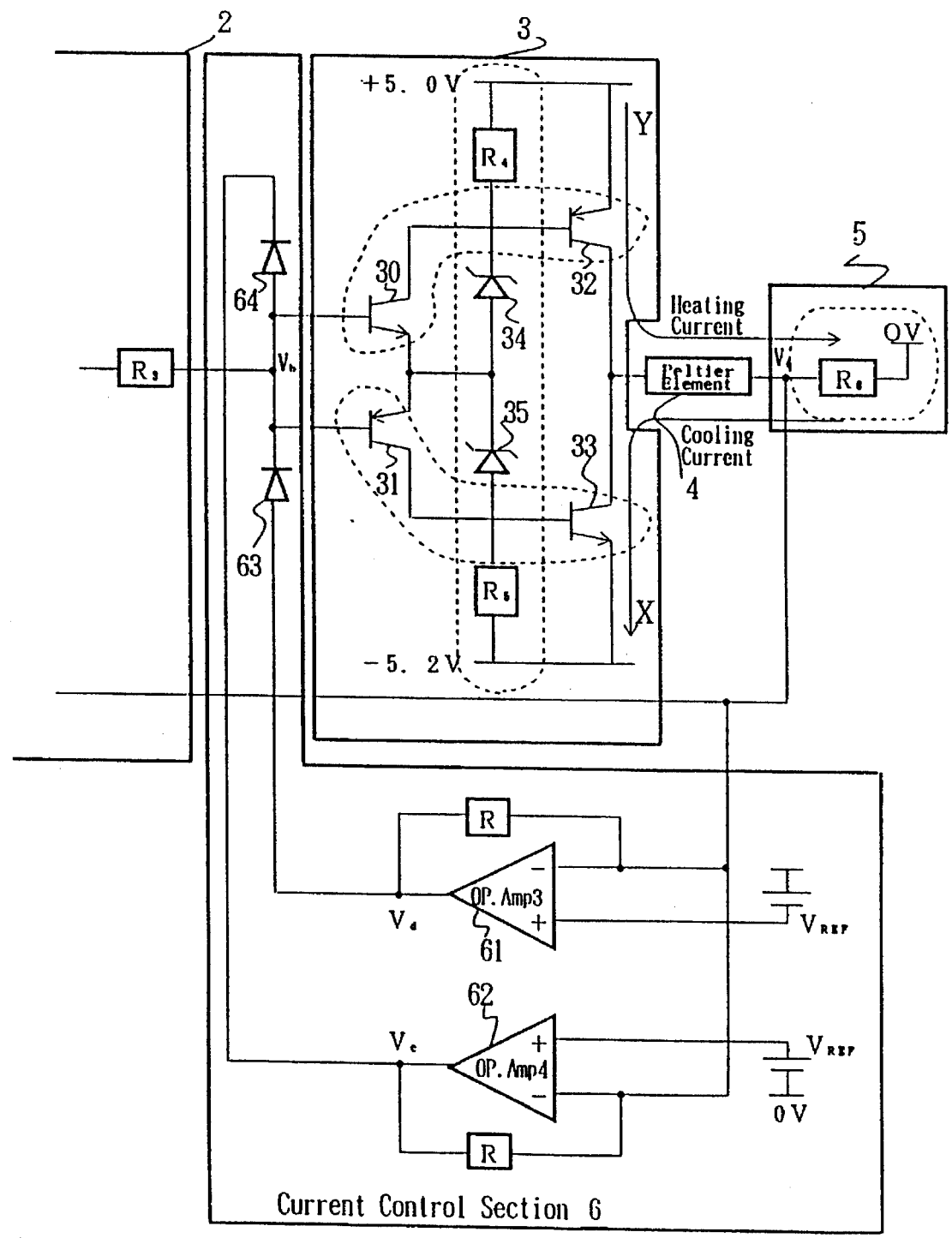
FIG. 4 is a diagram for explaining the second embodiment of the present invention.

FIG. 4 shows the second embodiment of the present invention. More particularly, it shows a structure for limiting the current flowing to the peltier element 4. In the diagram, as explained relating to the explanation of "Description of the Related Art" above, if there is a gap between the ambient temperature and the setting temperature, when the power is supplied, it is apprehended to break down the circuit because the larger current flows to the peltier element for controlling the temperature to the setting temperature. In the method of the conventional circuit to overcome the drawback, there is a large number of steps for controlling and testing the current.

The circuit shown in FIG. 4 for solving the conventional problems is shown by picking out a part of the error amplifying section 2 in the embodiment shown in FIG. 1 and the peltier driving section 3 to be clear a part added for the embodiment shown in FIG. 1.

That is, the circuit block 6 is a current control section added as the second embodiment of the present invention in FIG. 4. The current control section 6 comprises two operational amplifiers 61 and 62, of which negative input terminals are connected to the output side of the peltier element 4 in common and supplied the potential Ve of the resistor R6 in the current monitoring section 5.

Further, the negative reference voltage $-V_{REF}$ and the positive reference voltage $V_{REF}$ are supplied and connected to the positive input terminal of one operational amplifier 61 and the positive input terminal of another operational amplifier 62, respectively.

Furthermore, the diodes 63 and 64 connected in series are provided between the output terminals of two operational amplifiers 61 and 62. The series connecting point between the diodes 63 and 64 connected in series is connected to the common base of the output resistor R3 in the error amplifying section 2 and transistors 30 and 31.

With such a structure, in the case where the temperature goes up, the Vth (refer to FIG. 2) goes up, and the Vb goes down. Then, the transistors 31 and 33 become in the ON state, and the cooling current in the X direction flows to the peltier element 4.

As the result, as the voltage Ve of the connecting point between the peltier element 4 and the resistor R6 in the current monitoring section 5 goes down, the output potentials Vd and Vc of the operational amplifiers 61 and 62 go up. When the Vd becomes larger than the Vb, the current flows to the diode 63, and the differential potential for the voltage breakdown Vbe in the direction of easy flow of the diode 63 is generated between the Vd and Vb.

Accordingly, the potential Vb is clamped by the Vd, so that it becomes possible to limit the current flowing to the peltier element 4.

Further, in the case where the temperature also goes down, the current flows to the diodes 64, according to the same principle, and the voltage Vb is clamped by the output potential Vc of the operational amplifier 62, so that it becomes possible to limit the current flowing to the peltier element 4.

The structure for solving the problem that the current in the reversed direction to the direction to be controlled when only one source is supplied, as described relating to the explanation of "Description of the Related Art" as the third embodiment of the present invention will be described as follows, as the third embodiment of the present invention.

As shown in FIGS. 1 to 4, the circuit comprises the two zener diodes 34 and 35 connected in series between the plus source and minus source as the third embodiment of the present invention. For example, when the zener diodes 34 and 35 having the breakdown voltage of 4 V are used, the voltage of 8 V is required to be the two zener diodes 34 and 35 in the ON state.

Consequently, when only one source is supplied, enough voltage to be the zener diodes in the ON status can not be obtained. Therefore, the bias voltages of the transistors 30 and 31 are not enough so that the zener diodes can not be in the ON state. Accordingly, the conventional problem can be solved when the only one source is supplied, as the current does not flow to the peltier element 4.

Figure 5:
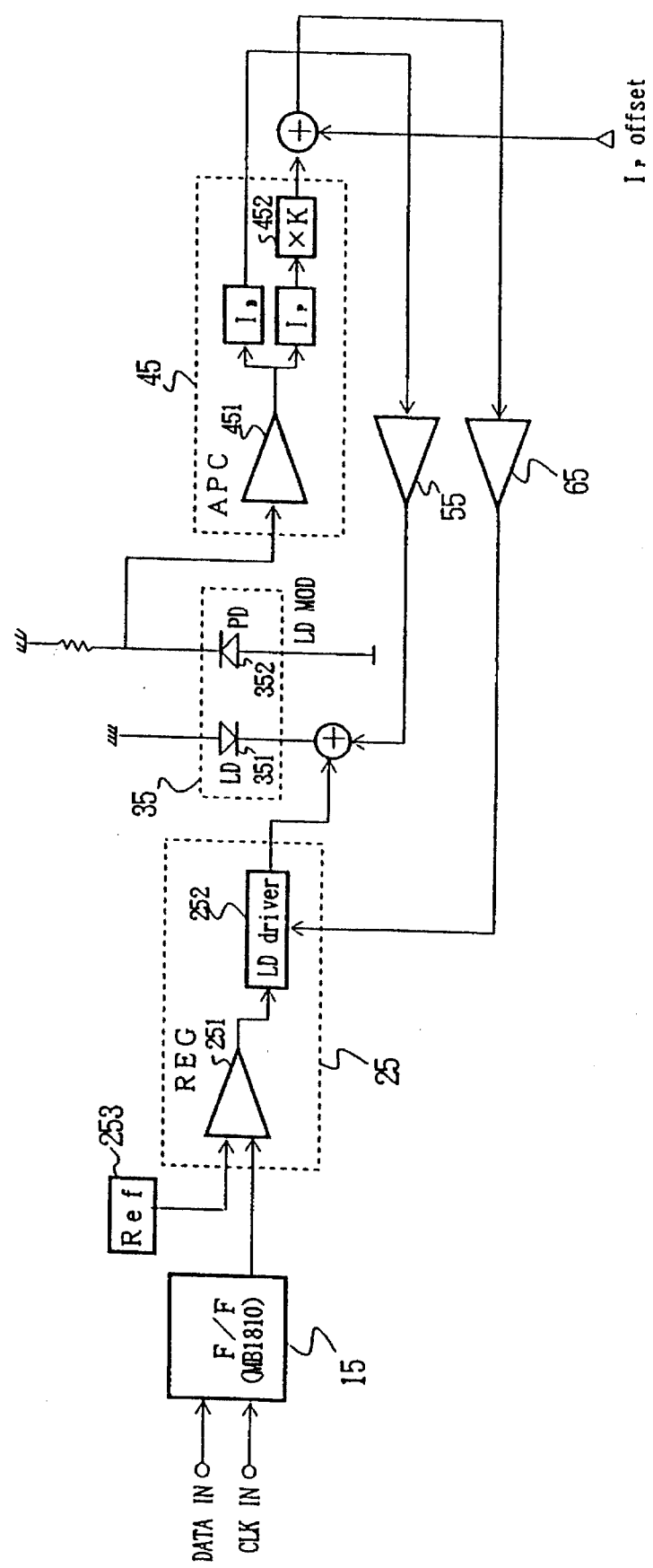
FIG. 5 is a general structural block diagram of an electric/optical converting unit.

FIG. 5 is a general structural block diagram of the electric/optical converting unit. In the diagram, a flip-flop circuit 15 synchronizes to a clock CLK and shapes the inputted electrical signal data DATA.

A reproducing circuit 25 comprises a comparator 251 and a laser diode driving circuit 252. A reference voltage 253 is given to one input terminal of the comparator 251, and the electrical signal data DATA shaped by the flip-flop circuit 15 is inputted to another input terminal.

The comparator 251 generates a pulse output when the electrical signal data DATA exceeds the reference voltage 253.

Reference numeral 35 is a laser diode module, in which the laser diode 351 and the receipt-light diode or photo diode 352 are unitedly provided as one module. The laser diode 351 is driven by the current piled up the signal current Ip corresponding to the pulse output from the laser diode driving circuit 252 and the bias current $I_B$.

The photo diode 352 receives a part of optical power of the laser diode 351, and inputs it to an automatic power control circuit 45. The automatic power control circuit 45 comprises a buffer amplifier 451 and a coefficient circuit 452.

The buffer amplifier 451 has a function for converting the voltage corresponding to the optical power of the laser diode 351 detected by the photo diode 352 to the current. The current converted in the buffer amplifier 451 is branched to the bias current $I_B$ and the signal current $I_p$.

The bias current $I_B$ is fed back via the amplifier 55 as a bias current of the laser diode 351. On the other hand, the signal current $I_p$ is multiplied a fixed amount of coefficient-fold by the coefficient circuit 452, and fed back to the laser diode driving circuit 252 via the amplifier 65.

Figure 8:
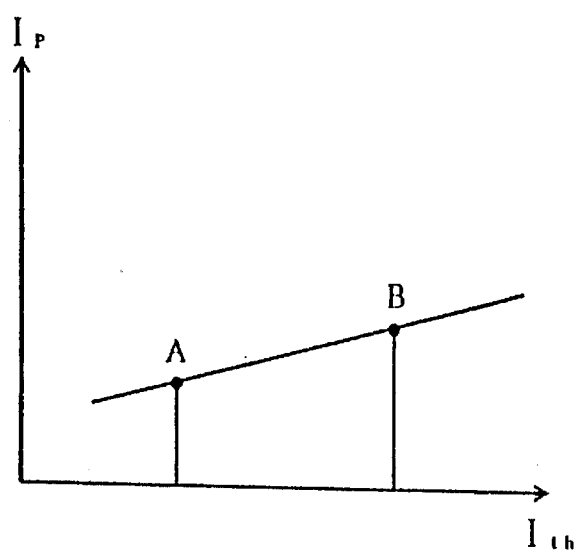
FIG. 8 is a diagram showing the relation between the threshold current (Ith) and the driving signal current (Ip).
Figure 9:
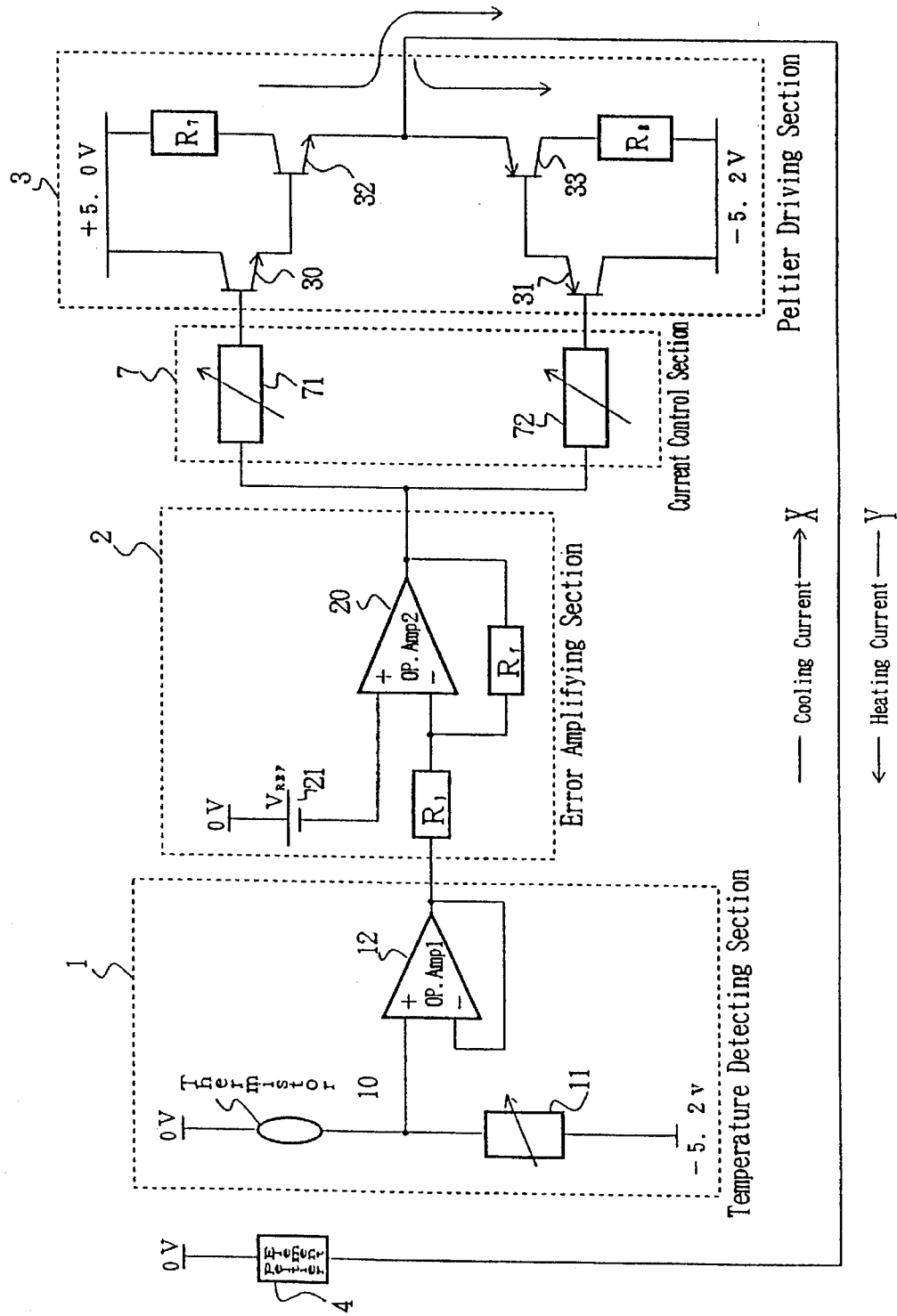
FIG. 9 is a conventional structural example of the automatic temperature control circuit.

The amount of the coefficient in the coefficient circuit 452 is multiplied a fixed amount of coefficient-fold by the coefficient circuit 452, so as to be constant for the bias current $I_B$ in correspondence with the Ith ($I_B$) to Ip characteristic of the laser diode 351 as explained in FIG. 8.

Further, in the laser diode driving circuit 252, in which the signal current $I_p$ is given via the amplifier 65, the driving signal current is controlled so as that the level of the feed-backed signal current $I_p$ becomes constant.

In this way, the automatic power is controlled so as to obtain the optical power having the constant level by detecting and feed backing the level of the optical power of the laser diode 351 in the circuit shown in FIG. 5.

However, it is not enough only to control the automatic power. Thus, the automatic temperature control circuit of the laser diode is provided.

Figure 6:
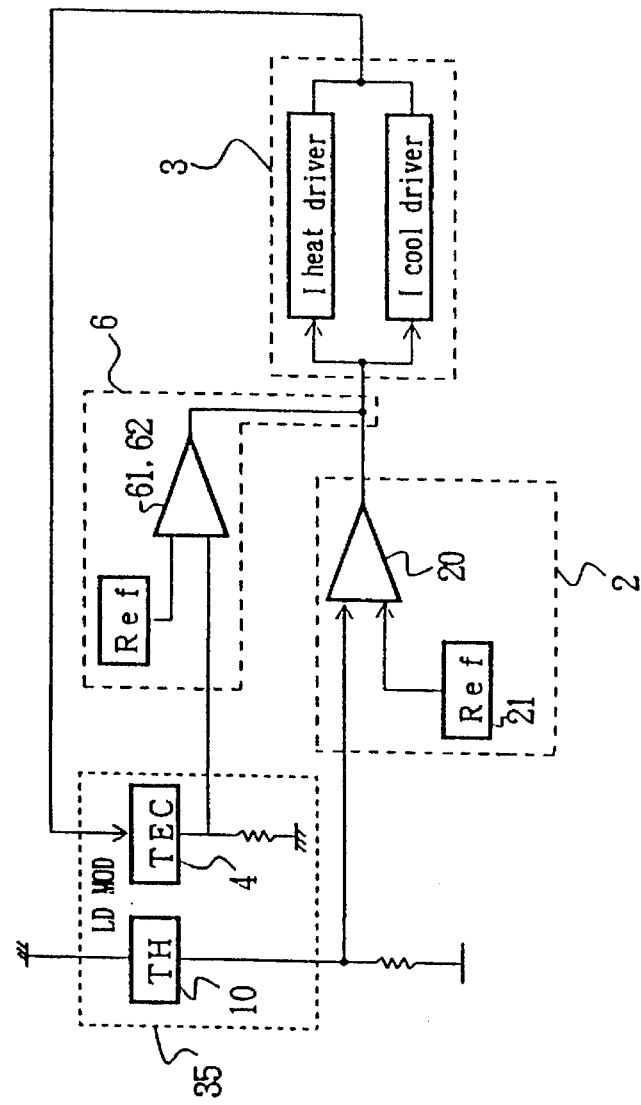
FIG. 6 is a diagram for explaining the embodiment in the case where the automatic temperature control circuit according to the present invention is used in the electric/optical signal converting unit.
Figure 7:
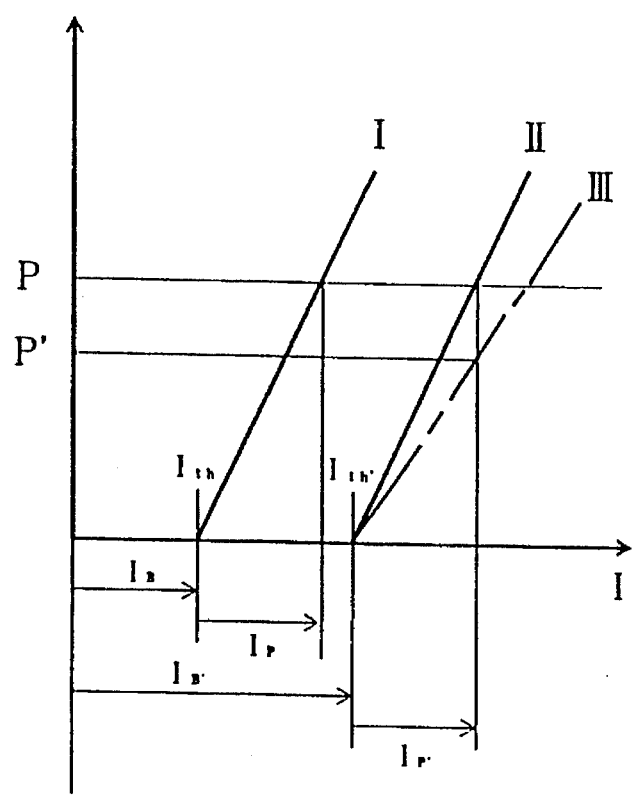
FIG. 7 is a diagram showing one example of optical power characteristic of the laser diodes.

FIG. 6 is a diagram for explaining the embodiment in the case where the electric/optical signal converting unit explained in FIG. 5 is used by simplifying the automatic temperature control circuit shown in FIGS. 1 and 4 according to the present invention.

Accordingly, the same reference numerals and symbols used in FIG. 6 are used to denote and identify corresponding or identical components in FIGS. 1 and 4.

In the embodiment of the present invention, the thermistor 10 and the peltier element 4 are further stored unitedly in the laser diode module 35 stored the laser diode 351 and the photo diode 352 as a united module.

Therefore, it become possible to detect the temperature of the laser diode 351 by the thermistor 10, directly, and further, control the temperature of the laser diode 351 by flowing the heating or cooling current to the peltier element 4.

Although the present invention has been described with reference to embodiment, it becomes possible according to the present invention to solve the conventional problem brought from the temperature dead band depending on the error amplifying section for feed-backing including the peltier element driving section.

It further becomes possible to suppress the temperature fluctuation of the limited value of the peltier driving current to limit the peltier driving current by providing the monitoring section of the peltier current, and comparing the monitor value of the peltier current detected from the monitoring section and the setting reference value.

Further, it becomes possible to prevent from flowing unnecessary control current when only one power source is supplied by connecting the two zener diodes in series between the plus power source and minus power source.

The scope of the present invention is defined by the scope of the claim, and is not limited by the embodiment of the present invention.

It should be of course be understood that those which are the same as the technical concept of the invention are within the protective scope of the present invention.

What is claimed is:

1. An temperature control circuit for a laser diode comprising:

a peltier element for changing a temperature of the laser diode by heating or cooling;

a temperature detecting section for detecting the temperature of the laser diode and outputting a corresponding detected voltage;

an error amplifying section for outputting an error voltage by comparing the detected voltage outputted from the temperature detecting section with a predetermined value;

a peltier current driving section for controlling a direction of a driving current flowing to the peltier element in correspondence with the error voltage outputted from the error amplifying section; and a circuit for feeding back a voltage corresponding to the driving current flowing to the peltier element, to an input side of the error amplifying section, and adding it to the detected voltage outputted from the temperature detecting section.

2. The temperature control circuit according to claim 1, wherein the temperature detecting section has a thermistor and a resistor connected to the thermistor in series, and further a non-inverse amplifier for inputting a voltage generated in the resistor to the error amplifying section.

3. The temperature control circuit according to claim 2, wherein the thermistor and the peltier element are both positioned in the laser diode.

4. The temperature control circuit of laser diodes according to claim 2, wherein the error amplifying section has an operational amplifier provided with a first and a second input terminals, the predetermined value is inputted to the first input terminal and outputs of the temperature detecting section and the circuit for feeding back the voltage are inputted to the second input terminal.

5. The temperature control circuit according to claim 1, wherein the peltier current driving section has a pair of transistors having a reversed polarity relative to each other and being connected between two current sources in series, and the peltier element is connected to a connecting point of the pair of transistors.

6. The temperature control circuit according to claim 5, wherein the peltier current driving section has a pair of transistors having the reversed polarity each other connected in series, each collector or emitter is connected to each base of the pair of transistors, and each base of the pair of transistors is commonly connected to the output of the error amplifying section.

7. The temperature control circuit according to claim 6, wherein the peltier current driving section further has a pair of zener diodes connected between the sources in series, and a common connecting point of the pair of zener diodes is connected to a common connecting point of the pair of transistors.

8. The temperature control circuit according to claim 6, further comprising:

a pair of diodes series connected in a direction of least resistance; and a pair of operational amplifiers between output terminals of which both ends of said pair of diodes are connected in series, respectively, said amplifiers having first input terminals to which reference voltages having a reversed polarity relative to each other are inputted and second input terminals to which a voltage corresponding to the driving current flowing to the peltier element is commonly inputted, wherein an output of the error amplifying section and bases of the pair of transistors are connected to a series connecting point of the pair of diodes.

9. The temperature control circuit according to claim 1, further comprising:

a pair of diodes series connected in a direction of least resistance; and a pair of operational amplifiers, between output terminals of which both ends of said pair of diodes are connected in series, respectively, said amplifiers having first input terminals to which reference voltages having a reversed polarity relative to each other are inputted and second input terminals to which a voltage corresponding to the driving current flowing to the peltier element is commonly inputted, wherein an output of the error amplifying section and an input of the peltier current driving section are connected to a series connecting point of the pair of diodes.

10. A signal converting unit for converting an electric signal to an optical signal, comprising:

a power control section having a laser diode unit including a laser diode and a photo diode for detecting an optical power of the laser diode by the photo diode and controlling the bias current and the input signal level in correspondence with the detected signal power level; and a temperature control section having a peltier element positioned in the laser diode unit for changing a temperature of the laser diode by heating or cooling, a temperature detecting section for detecting a temperature of the laser diode and outputting a corresponding detected voltage, an error amplifying section for outputting an error voltage by comparing the detected voltage outputted from the temperature detecting section with a predetermined voltage, a peltier current driving section for controlling a direction of a driving current flowing to the peltier element in correspondence with the error voltage outputted from the error amplifying section, and a circuit for feeding back a voltage corresponding to the driving current flowing to the peltier element, to an input side of the error amplifying section and adding it to the detected voltage outputted from the temperature detecting section.

11. The signal converting unit according to claim 10, wherein the temperature detecting section has a thermistor and a resistor connected to the thermistor in series, and further a non-inverse amplifier for inputting a voltage generated in the resistor to the error amplifying section.

12. The signal converting signal according to claim 11, wherein the transistor and the peltier element are both positioned in the laser diode as a laser diode unit.

13. The signal converting unit according to claim 11, wherein the error amplifying section comprises an operational amplifier provided with a first and second input terminals, the predetermined value is inputted to the first input terminal and outputs of the temperature detecting section and the circuit for feeding back the voltage are inputted to the second input terminal.

14. The signal converting unit according to claim 10, wherein the peltier current driving section has a pair of transistors having an exact reversed polarity relative to each other and connected between two current sources in series, and the peltier element is connected to a connecting point of the pair of transistors.

15. The signal converting unit according to claim 14, wherein the peltier current driving section has a pair of transistors having an exact reversed polarity relative to each other and connected in series, each collector or emitter of the transistors is connected to each base of the pair of transistors, and each base of the pair of transistors is commonly connected to an output of the error amplifying section.

16. The signal converting unit according to claim 15, wherein the peltier current driving section further comprises a pair of zener diodes connected between the current sources in series, and a common connecting point of the pair of zener diodes is connected to a common connecting point of the pair of transistors.

17. The signal converting unit according to claim 15, further comprising:

a pair of diodes series connected in the direction of easy flow; and a pair of operational amplifiers between output terminals of which both ends of said pair of diodes are connected in series, respectively, said amplifiers having first input terminals to which reference voltages having an exact reversed polarity relative to each other are inputted and second input terminals to which a voltage corresponding to the driving current flowing to the peltier element is commonly inputted, wherein an output of the error amplifying section and bases of the pair of transistors are connected to a series connecting point of the pair of diodes.

18. The signal converting unit according to claim 10, further comprising:

a pair of diodes series connected in a direction of least resistance; and a pair of operational amplifiers, between output terminals of which both ends of said pair of diodes are connected in series, respectively, said amplifiers having first input terminals to which reference voltages having an exact reversed polarity relative to each other are inputted and second input terminals to which a voltage corresponding to the driving current flowing to the peltier element is commonly inputted, wherein an output of the error amplifying section and an input of the peltier current driving section are connected to a series connecting point of the pair of diodes.

* * * * *